United States Patent
Belin et al.

[11] Patent Number: 5,990,817
[45] Date of Patent: Nov. 23, 1999

[54] A/D CONVERSION DEVICE HAVING A PROGRAMMABLE TRANSFER CHARACTERISTIC

[75] Inventors: Philippe Belin, Epron; Hervé Marie, Saint Aubin/Mer, both of France

[73] Assignee: U.S. Philips Corporation, New York, N.Y.

[21] Appl. No.: 08/956,819

[22] Filed: Oct. 23, 1997

[30] Foreign Application Priority Data

Oct. 25, 1996 [FR] France .................................... 96 13067

[51] Int. Cl.$^6$ .................................................. H03M 1/62
[52] U.S. Cl. ........................... 341/139; 341/127; 341/159
[58] Field of Search ..................................... 341/127, 139, 341/159

[56] References Cited

U.S. PATENT DOCUMENTS

| | | | |
|---|---|---|---|
| 4,517,550 | 5/1985 | Nakamura et al. | 341/139 |
| 4,831,378 | 5/1989 | Baars et al. | 341/139 |
| 4,860,010 | 8/1989 | Iwamatsu | 341/118 |
| 5,343,200 | 8/1994 | Matsui | 341/139 |
| 5,365,233 | 11/1994 | Schaub | 341/139 |
| 5,608,399 | 3/1997 | Coleman, Jr. | 341/139 |

FOREIGN PATENT DOCUMENTS

0271936B1  6/1988  European Pat. Off. .

*Primary Examiner*—Michael Tokar
*Assistant Examiner*—Anh Q Tran
*Attorney, Agent, or Firm*—Steven R. Biren

[57] ABSTRACT

The invention relates to an A/D conversion device intended to supply at the output a digital signal Vout[0:7] resulting from the conversion of an analog input voltage Vin and receiving a control signal CRS used for defining the transfer characteristic of the device by way of comparison with the output signal Vout[0:7]. According to the invention, such a device comprises a reference module (AO, CMP2) which allows adjustment of the digital value of the output signal Vout[0:7] at a predetermined value when the analog input voltage Vin is zero, and means (Mx, Vact) for substituting for said voltage Vin a reference voltage Vref having a predetermined value when the device is in its control mode.

5 Claims, 2 Drawing Sheets

A/D CONVERSION DEVICE HAVING A PROGRAMMABLE TRANSFER CHARACTERISTIC

BACKGROUND OF THE INVENTION

The invention relates to an A/D conversion device having an analog input intended to receive an analog input voltage, an input intended to receive a regulation signal, and a digital output intended to supply a digital signal resulting from the conversion of the analog input voltage, comprising:
- a first amplifier having an output and a first signal input connected to the analog input, a second gain control input intended to receive a voltage allowing modification of the amplifier gain and connected to a power supply terminal via a storage capacitor,
- an A/D converter having an analog input connected to the output of the amplifier and an output constituting the output of the device,
- a regulation module having an enable input intended to receive an enable signal and comprising a first controllable current source connected to the storage capacitor with which the voltage at the terminals of said capacitor can be varied, and a first comparator intended to perform a comparison between a signal which is representative of the voltage at the output of the first amplifier and the regulation signal, and supplying a signal for controlling the conduction of the current source when the enable signal is in an active state.

Such a device is known from European patent application no. 0 271 936 B1 which describes a system for controlling the gain of the first amplifier, based on identification and control of a voltage level of reference thresholds of the output signal of said amplifier, which thresholds correspond to similar thresholds of the input signal. The amplifier gain is subsequently adjusted in such a way that the result of the A/D conversion of its output signal does not exceed a certain value, referred to as maximum digital value. This system has the drawback that it can only function with signals having reference thresholds of the video signal type, which are often altered by electromagnetic noise. The reference thresholds are then not very reliable, which jeopardizes the gain control of the amplifier. Moreover, the A/D conversion of signals having no reference thresholds is not possible with such a device.

SUMMARY OF THE INVENTION

It is an object of the invention to remedy these drawbacks by providing an A/D conversion device in which the analog input signal does not influence the gain control of the amplifier.

According to the invention, a device of this type is characterized in that it comprises a reference module which allows adjustment of the digital value of the output signal of the A/D converter at a predetermined value when the voltage at the signal input of the amplifier is zero, and means for substituting for the analog input voltage a reference voltage having a predetermined value when the enable signal is in the active state.

The transfer characteristic of this device, defined as the development of the digital value of the output signal as a function of the analog input voltage, is linear when the amplifier gain is fixed. Two working points of said characteristic are sufficient to define the behavior of the device. The reference module intrinsically defines a first working point while the value of the regulation signal allows adjustment of the position of the second working point of the transfer characteristic: when the enable signal is in the active state, the device operates in accordance with a regulation mode in which the signal input of the amplifier receives the reference voltage whose value is known. The gain of the amplifier is determined by the voltage at the terminals of the storage capacitor, which is adjusted in such a way that the signals received by the comparator are equal. The choice of the value of the regulation signal thus allows a simple adjustment of the operation of the device, independent of the analog input voltage.

An embodiment of the invention provides a device as described above, which is characterized in that, with the regulation signal being of a digital kind, the first comparator has a first digital input intended to receive said regulation signal, and a second digital input connected to the output of the A/D converter.

This embodiment, in which the regulation signal may be stored, for example in a register, allows an easy reconfiguration of the device by reprogramming the contents of said register.

The signal which is compared with the control signal results from an amplification. A modification of the value of the control signal thus provokes the risk of considerable variations in the gain of the amplifier. It may be advantageous to provide arrangements for a finer control of the value of said gain.

In accordance with a variant of the invention, an A/D conversion device as described above is characterized in that the device comprises a variation module having a first voltage input intended to receive a predetermined fixed voltage, a second control input intended to receive a control signal, and an output intended to supply the reference voltage which, with respect to the fixed voltage, has a potential difference whose value is determined by the control signal.

This variation module allows modification of the value of the reference voltage, the amplitude of the variations thus obtained before amplification in the control mode preferably being low with respect to the value of the fixed voltage. It is thus possible to refine the control of the position of the second working point realized by means of the regulation signal.

In an embodiment of this variant, an A/D conversion device as described above is characterized in that the variation module comprises a resistor having a first terminal which is intended to receive the fixed voltage, and a second terminal, constituting the output of the variation module, connected to a second current source having an adjustable current supply, and a D/A converter having a digital input constituting the control input of the variation module and an analog output intended to supply a signal allowing adjustment of the value of the current supplied by the second current source.

In this embodiment, the control signal may be stored in a register, which allows an easy reconfiguration of the device by reprogramming the contents of said register.

In an advantageous embodiment of the invention, the A/D converter is provided with a resistance ladder intended to supply at each junction point between two resistors, a voltage which is used by the converter to define a reference code, while the reference module comprises:
- a second amplifier similar to the first amplifier, second amplifier whose signal input is intended to be placed at a zero potential and whose gain control input is intended to be placed at a predetermined potential, a second comparator having an output, a first input connected to the output of the second amplifier and a second input connected to one of the junction points of the resistance ladder, and a third controllable current source intended to supply a bias current via the resistance ladder, said current having a value which is determined by the value of the voltage at the output of the second comparator.

Such a reference module intrinsically defines, by means of the bias of the reference ladder, the first working point of the device in a simple and reliable manner. The bias current flowing through the resistance ladder is permanently controlled in such a way that a zero value of the input voltage corresponds to a fixed digital value of the output signal determined by the position within the resistance ladder of that one of the junction points which is connected to the comparator.

These and other aspects of the invention are apparent from and will be elucidated with reference to the embodiments described hereinafter.

DESCRIPTION OF THE PREFERRED EMBODIMENTS

Figure 1:
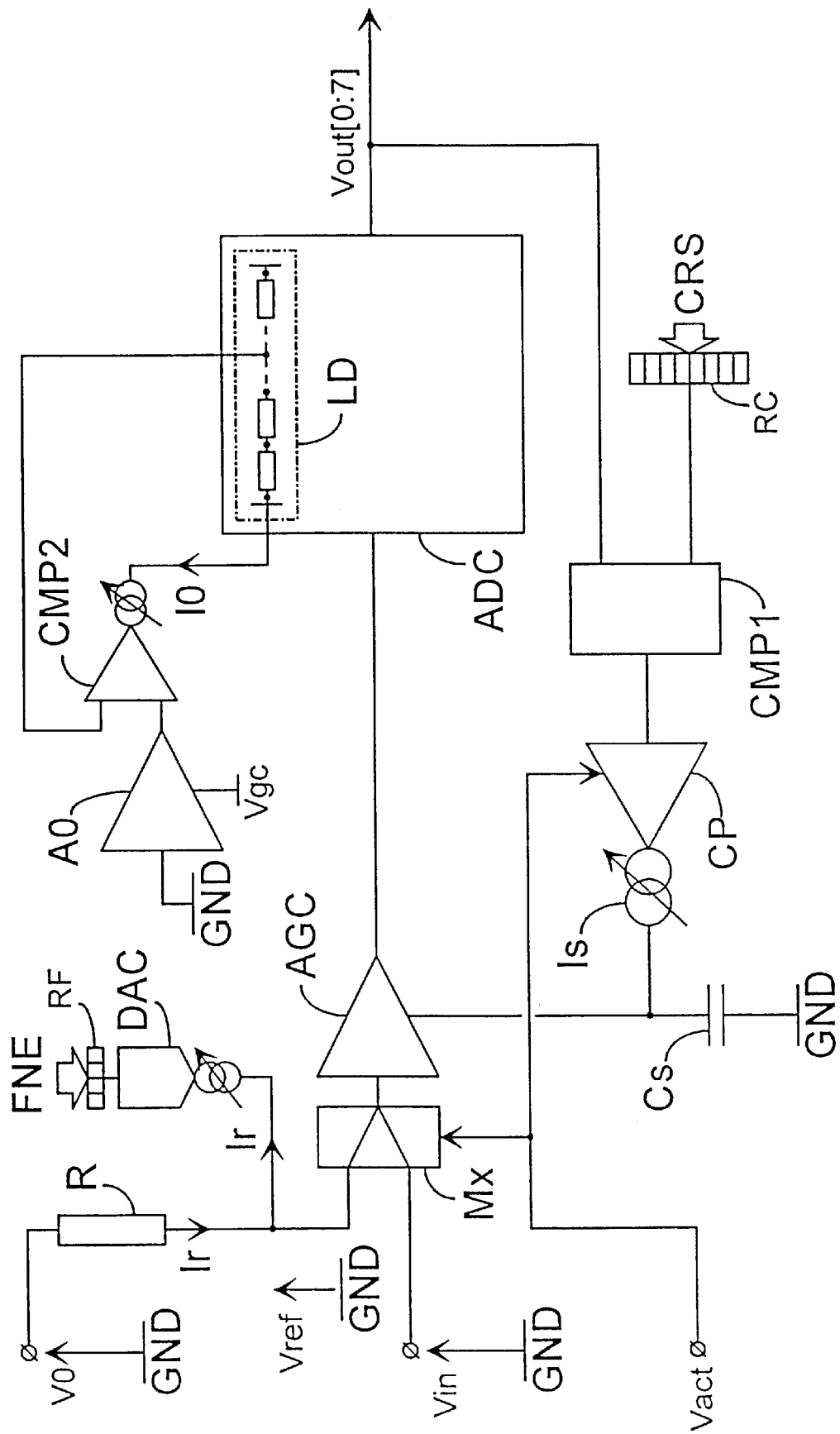
FIG. 1 is a partial functional diagram of an A/D conversion device in accordance with an advantageous embodiment of the invention.

FIG. 1 shows diagrammatically an A/D conversion device in accordance with an advantageous embodiment of the invention. This device has an analog input intended to receive an analog input voltage Vin, an input intended to receive a regulation signal CRS from a first register RC and a digital output intended to supply a digital signal Vout[0:7] resulting from the conversion of the analog input voltage Vin. This device comprises:

a first amplifier AGC, for example constructed on the basis of a Gilbert cell, having an output and a first signal input connected to the analog input, a second gain control input intended to receive a voltage allowing modification of the amplifier gain and connected to a power supply terminal GND via a storage capacitor Cs, an A/D converter ADC having an analog input connected to the output of the amplifier AGC and an output, coded at 8 bits in this embodiment and constituting the output of the device, provided with a resistance ladder LD supplying, at each junction point between two resistors, a voltage which is used by the converter ADC to define a reference code, a regulation module having an enable input intended to receive an enable signal Vact and comprising a first controllable current source Is connected to the storage capacitor Cs, and allowing a variation of the voltage at the terminals of said capacitor Cs, and a first comparator CMP1 intended to perform a digital comparison between the output signal Vout[0:7] and the regulation signal CRS, and supplying to a charge pump CP a signal allowing control of the conduction of the current source Is when the enable signal Vact is in an active state. This device also comprises a multiplexer Mx having an output connected to the signal input of the first amplifier AGC, a first data input receiving a reference voltage Vref having a predetermined value, a second data input receiving the analog input voltage Vin and a selection input receiving the enable signal Vact. This multiplexer allows to substitute for the analog input voltage Vin the reference voltage Vref when the enable signal Vact is in the active state, i.e. in the regulation mode. The device also comprises a reference module which allows adjustment of the digital value of the output signal Vout[0:7] of the converter ADC at a predetermined value when the voltage at the signal input of the amplifier AGC is zero. This reference module comprises:

a second amplifier AO which is similar to the first amplifier AGC, which second amplifier AO has its signal input at a zero potential and its gain control input at a predetermined potential Vgc, a second comparator CMP2 of an analog kind, having an output, a first input connected to the output of the second amplifier AO and a second input connected to one of the junction points of the resistance ladder LD, and a controllable current source supplying a bias current IO via the resistance ladder LD, which current IO has a value which is determined by the value of the voltage at the output of the second comparator CMP2.

The A/D conversion device shown comprises a resistor R, having a first terminal which is intended to receive a fixed voltage VO, and a second terminal which supplies the reference voltage Vref and is connected to a current source whose supply of current Ir is controllable. The device also comprises a D/A converter DAC having a digital input receiving a control signal FNE from a register RF, and an analog output supplying a signal allowing control of the value of the current Ir. In this embodiment, the input of the D/A converter DAC is coded at 4 bits.

The junction point of the resistance ladder LD which is connected to the second comparator CM2 is, in this embodiment, the point situated halfway down the resistance ladder. Since the output of the A/D converter ADC is coded at 8 bits and can thus present 256 different values, referred to as codes, this point defines the code 128. The potential of this point corresponds to a zero value at the input of the second amplifier AO, which is a replica of the amplifier AGC. Consequently, if the analog input voltage Vin is zero, the code obtained at the output of the A/D converter ADC will be the code 128. If Vin is negative, the code obtained at the output will be smaller than code 128, and if Vin is positive, the code obtained at the output will be higher than code 128. In the two latter cases, the value of the code will be a function of the value of the gain of the first amplifier AGC: the regulation signal CRS may assume a certain number of values between a minimum value, CRSmin, and a maximum value, CRSmax. For a same reference voltage Vref, the change of a value of CRS to a higher value will produce the following effects when the device is in the regulation mode: since digital value of the output signal Vout[0:7] of the A/D converter ADC will be smaller than the value of CRS, the output of the comparator CMP1 acts on the charge pump CP in order that the current source Is injects a current into the storage capacitor Cs, while the enable signal Vact is active. As the voltage at the terminals of the storage capacitor Cs increases, the gain of the amplifier AGC also increases until the values of the signals Vout[0:7] and CRS become equal, which modifies the transfer characteristic of the device and thus redefines its behavior. The variation gap obtained by changing the values of CRS, which can be defined by the number of codes separating two codes obtained for two successive values of CRS by maintaining the reference voltage unchanged, is important. It is possible to reduce this gap and to improve the definition of the transfer characteristic by varying the reference voltage Vref, which is realized in this embodiment by means of the D/A converter DAC. The amplitude of the variations thus obtained must remain low with respect to the value of the fixed voltage VO. The control signal FNE may assume 16 different values between 0 and 15 and thus control the conductance of a current Ir which can assume as many different values. This current Ir flowing in the resistor R creates, at the terminals of this resistor, a voltage drop having a value which depends directly on the digital value of the control signal FNE. If this value is 0, the gain obtained by means of the control module is unchanged. If this value is different from 0, the reference voltage Vref decreases and the digital value of the output signal Vout[0:7] decreases. Since the value of CRS is unchanged in this example, the comparator CMP1 controls the injection of a current Is into the storage capacitor Cs, thus increasing the gain of the amplifier AGC until the input signals of the first comparator CMP1 have equal values.

Figure 2:
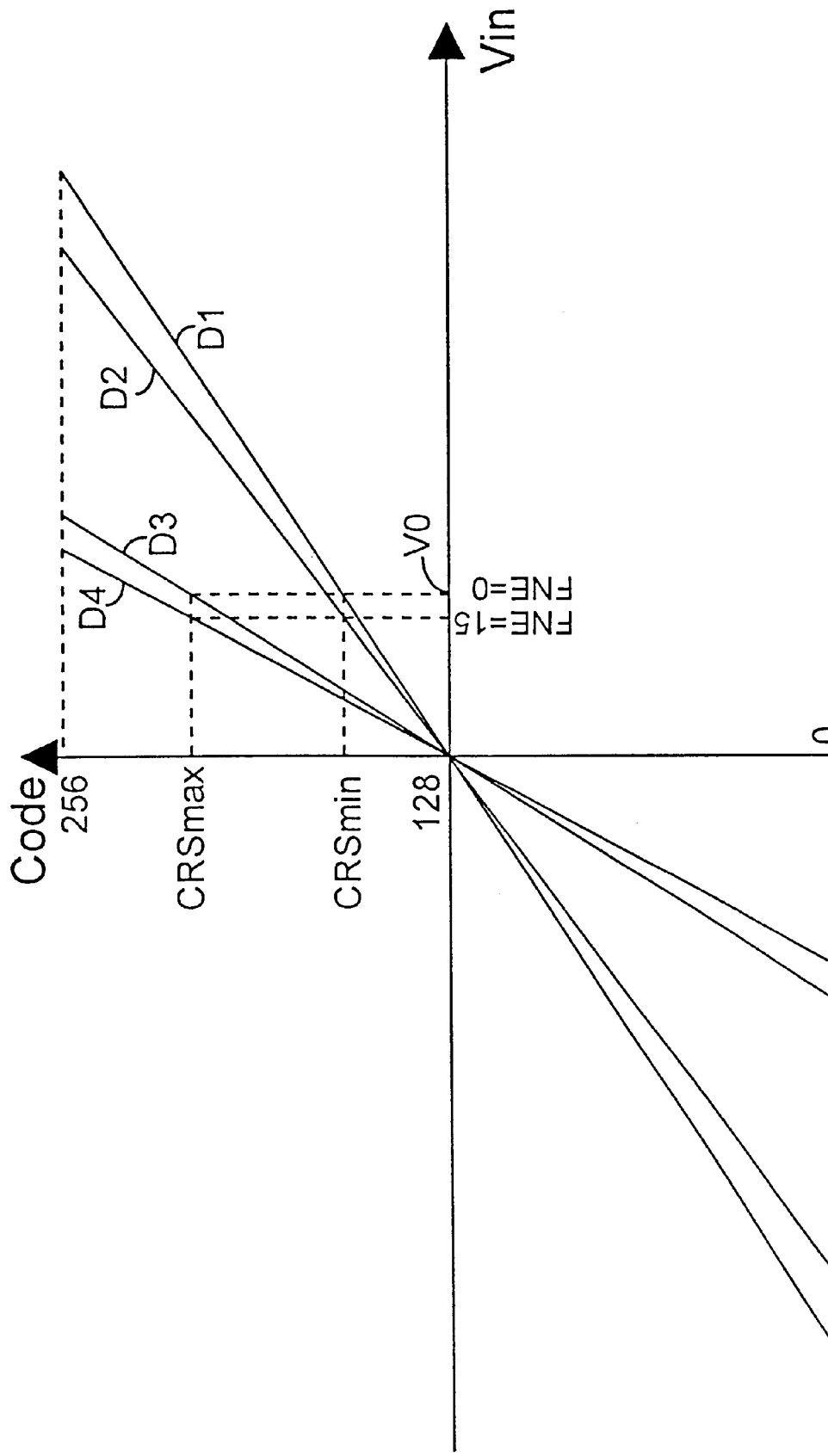
FIG. 2 shows various transfer characteristics corresponding to such a device.

FIG. 2 shows various transfer characteristics corresponding to such a device. The code 128 is fixed and corresponds to a zero analog input voltage Vin, irrespective of the value of the gain of the first amplifier AGC. Four extreme cases are shown here: the solid line D1 corresponds to the case where the regulation signal CRS has its minimum value, CRSmin, while the value of the control signal FNE is zero. The gain of the amplifier AGC is then at its minimum. The solid line D2 corresponds to the case where the control signal FNE value is 15, its maximum value, while the value of CRS is still CRSmin. The surface separating the solid lines may be scanned, in fine gaps, by varying the value of FNE between 0 and 15. The solid line D3 corresponds to the case where the regulation signal CRS has its maximum value, CRSmax, while the control signal FNE has a zero value. The solid line D4 corresponds to the case where the value of CRS is still CRSmax and the value of the control signal FNE is 15, its maximum value. The gain of the amplifier AGC is then at its maximum. The surface separating these two solid lines may be scanned, in fine gaps, by varying the value of FNE between 0 and 15.

FIG. 2 also shows that it is not necessary to code the signal CRS at 8 bits for obtaining significant variations of the transfer characteristic of the device. This enables to reduce the complexity the comparator CMP1 and thus to decrease the surface necessary for its implementation. On the other hand, if in the embodiment described, the comparator CMP1 performs a digital comparison of the output signal Vout[0:7] of the A/D converter ADC with the regulation signal CRS, in other embodiments which do not depart from the scope of the invention and are within those skilled in the art's reach, it is possible to compare the analog output of the first amplifier AGC with an analog regulation signal by means of a comparator CMP1 of an analog kind. Similarly, if the analog signals processed in this case are asymmetrical signals, those skilled in the art will be able to realize minor modifications of the device so that symmetrical signals can be processed.

What is claimed is:

1. An A/D conversion device having an analog input intended to receive an analog input voltage, an input intended to receive a regulation signal, and a digital output intended to supply a digital signal resulting from the conversion of the analog input voltage, comprising:

a amplifier having an output and a first signal input connected to the analog input, a gain control input intended to receive a voltage allowing modification of the amplifier gain and connected to a power supply terminal via a storage capacitor, an A/D converter having an analog input connected to the output of the amplifier and an output constituting the output of the device, a regulation module having an enable input intended to receive an enable signal and comprising a first controllable current source connected to the storage capacitor with which the voltage at the terminals of said capacitor can be varied, and a first comparator intended to perform a comparison between a signal which is representative of the voltage at the output of the first amplifier and the regulation signal, and supplying a signal for controlling the conduction of the current source when the enable signal is in an active state, characterized in that the device comprises a reference module which allows adjustment of the digital value of the output signal of the A/D converter at a predetermined value when the voltage at the signal input of the amplifier is zero, and means for substituting for the analog input voltage a reference voltage having a predetermined value when the enable signal is in the active state.

2. An A/D conversion device as claimed in claim 1, characterized in that, with the regulation signal being digital, the first comparator has a first digital input intended to receive said regulation signal, and a second digital input connected to the output of the A/D converter.

3. An A/D conversion device as claimed in claim 1, characterized in that the device comprises a variation module having a voltage input intended to receive a predetermined fixed voltage, a control input intended to receive a control signal, and an output intended to supply the reference voltage which, with respect to the fixed voltage, has a potential difference whose value is determined by the control signal.

4. An A/D conversion device as claimed in claim 3, characterized in that the variation module comprises a resistor having a first terminal which is intended to receive the fixed voltage, and a second terminal, constituting the output of the variation module, connected to a second current source having an adjustable current supply, and an D/A converter having a digital input constituting the control input of the variation module and an analog output intended to supply a signal allowing adjustment of the value of the current supplied by the second current source.

5. An A/D conversion device as claimed in claim 1, characterized in that the A/D converter is provided with a resistance ladder intended to supply, at each junction point between two resistors, a voltage which is used by the converter to define a reference code, wherein the reference module comprises:

a similar to the first amplifier, second amplifier whose signal input is intended to be placed at a zero potential and whose gain control input is intended to be placed at a predetermined potential, a second comparator having an output, a first input connected to the output of the second amplifier and a second input connected to one of the junction points of the resistance ladder, and a second controllable current source intended to supply a bias current via the resistance ladder, said bias current having a value which is determined by the value of the voltage at the output of the second comparator.

* * * * *